(12) United States Patent
Keohane et al.

(10) Patent No.: US 7,844,354 B2
(45) Date of Patent: Nov. 30, 2010

(54) ADJUSTING THE VOLUME OF AN AUDIO ELEMENT RESPONSIVE TO A USER SCROLLING THROUGH A BROWSER WINDOW

(75) Inventors: Susann Keohane, Austin, TX (US);
Gerald F. McBrearty, Austin, TX (US);
Shawn P. Mullen, Buda, TX (US);
Jessica Murillo, Round Rock, TX (US);
Johnny M. Shieh, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1159 days.

(21) Appl. No.: 11/460,473

(22) Filed: Jul. 27, 2006

(65) Prior Publication Data

US 2008/0025529 A1      Jan. 31, 2008

(51) Int. Cl.
*G06F 17/00* (2006.01)
(52) U.S. Cl. ....................................................... 700/94
(58) Field of Classification Search ................... 700/94; 381/104–109
See application file for complete search history.

(56) References Cited

U.S. PATENT DOCUMENTS

| 6,370,254 B1 | 4/2002 | Gore |
| 6,370,354 B1 * | 4/2002 | Chapman et al. ............ 399/394 |
| 6,469,712 B1 | 10/2002 | Hilpert, Jr. et al. |
| 6,848,996 B2 * | 2/2005 | Hecht et al. .................... 463/35 |
| 6,935,955 B1 * | 8/2005 | Kaminkow et al. ........... 463/35 |
| 6,945,871 B2 * | 9/2005 | Uenishi et al. ................. 463/35 |

FOREIGN PATENT DOCUMENTS

WO       0139011 A3      5/2001

* cited by examiner

*Primary Examiner*—Andrew C Flanders
(74) *Attorney, Agent, or Firm*—Matthew W. Baca; Amy J. Pattillo

(57) ABSTRACT

A scroll-based volume controller detects a user selection to scroll through a browser window loaded with data comprising at least one display element, wherein an audio element is associated with the display element and wherein the size of the displayable data is larger than the display area of the browser window. The scroll-based volume controller, responsive to detecting the user selection to scroll through the browser window, calculates a change in position of the display element relative to the browser window. The audio element may include an audio file that is downloaded or streamed to the browser. Next, the scroll-based volume controller automatically adjusts a volume of the associated audio element based on the calculated change in position of the display element relative to the browser window, such that the volume of the audio element, associated with said display element, is automatically adjusted as the position of the display element changes relative to the particular browser window when the user scrolls through the data in the browser window, without the user having to separately select to adjust the volume of the audio element using a separate volume control input.

20 Claims, 5 Drawing Sheets

ADJUSTING THE VOLUME OF AN AUDIO ELEMENT RESPONSIVE TO A USER SCROLLING THROUGH A BROWSER WINDOW

TECHNICAL FIELD

The present invention relates in general to improved volume control. In particular, the present invention relates to dynamically adjusting a volume of an audio element associated with a display element within a browser window, wherein the volume is adjusted as the position of the display element changes relative to the browser window as the user scrolls through the data displayed in the browser window.

DESCRIPTION OF THE RELATED ART

Many downloadable web pages and other types of network transportable data include audio elements that a browser downloading the web pages at a client system detects and plays automatically. In one example, a web page may include a video object in which video, which includes audio, streams into and plays automatically. In another example, a web page may include an audio player that when loaded at a client system, automatically controls download and triggers play of a sound file accessed from a server.

While a developer of a web page may trigger automatic play of audio associated with the web page, when the web page is opened, the user opening a web page may find the automatic start of audio output disruptive. Further, in particular to video, but also relevant to any audio element, as a user scrolls through a web page to look at elements other than the video element, the video element may decrease in relevance to the user or the user may prefer to view other information on a web page without the disruption of the audio portion of a playing video.

Alternatively, a developer may not trigger automatic play of an audio element associated with a web page because the web page includes multiple display elements, each associated with a different audio element, such as a scrollable listing of songs. In this example, for the user to listen to each song or a sample of each song, the user must manually trigger the play of each song or a sample of each song by individually clicking on each display element for each song. While the developer in this example provides the user with control over what audio will be output in association with a web page, when a user is scrolling through a list of song elements, having to stop to actually select to hear a particular song requires additional inputs by the user.

Therefore, in view of the foregoing, it would be advantageous to provide a method, system, and program for automatically adjusting the volume of an audio element already triggered to play in association with a display element within the data delivered to a browser window, responsive to a user selection to scroll through the data displayed in the browser window. In addition, it would be advantageous to provide a method, system, and program for automatically triggering the play of an audio element associated with a display element within the data delivered to a browser window responsive to user adjustment, by scrolling, of the position of that display element displayed within the browser window.

SUMMARY OF THE INVENTION

Therefore, the invention provides volume control of audio elements associated with a browser window. The invention provides for dynamically adjusting a volume of an audio element associated with a display element within a browser window, wherein the volume is adjusted as the position of the display element changes relative to the browser window as the user scrolls through the data displayed in the browser window.

A scroll-based volume controller detects a user selection to scroll through a browser window loaded with data comprising at least one display element, wherein an audio element is associated with the display element and wherein the size of the displayable data is larger than the display area of the browser window. The scroll-based volume controller, responsive to detecting the user selection to scroll through the browser window, calculates a change in position of the display element relative to the browser window. The audio element includes an audio file that is downloaded or streamed to the browser. The scroll-based volume controller automatically adjusts a volume of the associated audio element based on the calculated change in position of the display element relative to the browser window, such that the volume of the audio element, associated with said display element, is automatically adjusted as the position of the display element changes relative to the particular browser window when the user scrolls through the data in the browser window, without the user having to separately select to adjust the volume of the audio element using a separate volume control input.

The scroll-based volume controller detects whether the display element is scrolled away from the display area of the browser window, responsive to the user selection to scroll through data loaded in the browser window. If the display element is scrolled away from the display area, then the scroll-based volume controller automatically calculates an adjustment in volume for the audio element reduced by the change in position relative to the browser window. If the display element is scrolled towards the display area, then the scroll-based volume controller automatically calculates an adjustment in volume for the audio element increased by the change in position relative to the browser window.

The scroll-based volume controller detects whether the display element is scrolled to the left or the right of the display area of the browser window responsive to the user selection to scroll through the data loaded in the browser window. If the display element is scrolled to the left of the display area of the browser window, the scroll-based volume controller automatically calculates an adjustment in volume for the audio element to shift a portion of the volume to at least one speaker positioned to the left. If the display element is scrolled to the right of the display area of the browser window, the scroll-based volume controller automatically calculates an adjustment in volume for the audio element to shift a portion of the volume to at least one speaker positioned to the right.

Responsive to the user selection to scroll through the data loaded in the browser window, the scroll-based volume controller detects whether the display element is within a list of multiple display elements, each associated with a separate audio element loaded with the data. Responsive to detecting that the display element is within a list of multiple display elements, each associated with a separate audio element, the scroll-based volume controller automatically triggers play of the audio element associated with the display element.

The scroll-based volume controller detects when the display element is adjusted in position from a first position outside a display area of the browser window to a second position within the display area of the browser window, responsive to the user selection to scroll through the data loaded in the browser window. Responsive to detecting a display element adjust from a first position outside a display area to a second position within the display area, the scroll-based volume controller detects that the audio element associated with the display element requires a user selection to begin play and automatically triggers play of the audio element as the associated display element enters the display area of the browser window.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
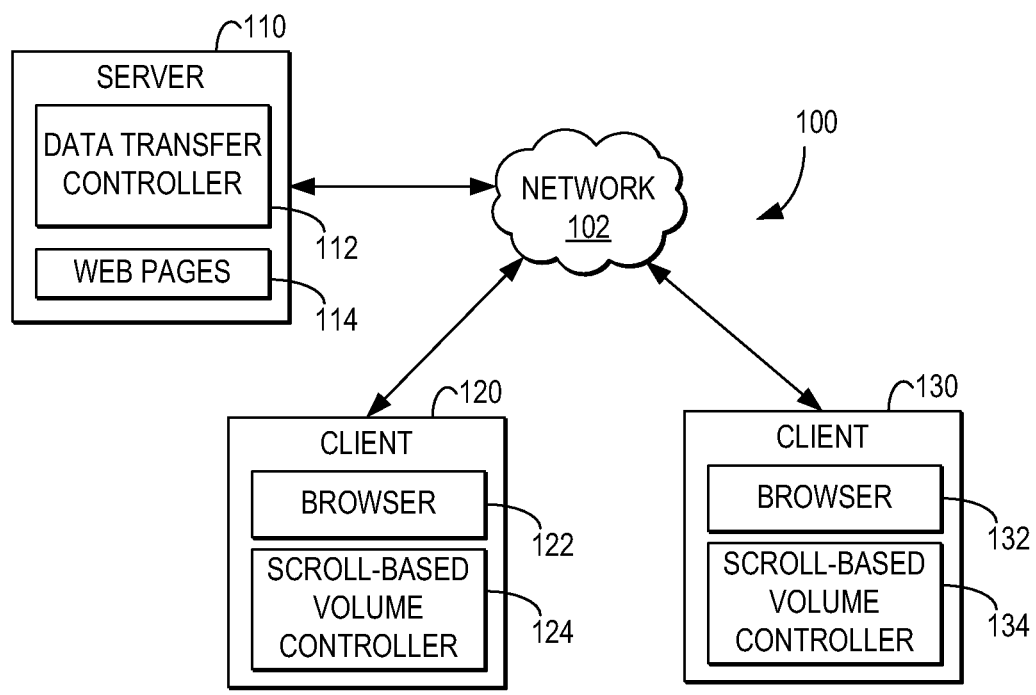
FIG. 1 is a block diagram depicting one embodiment of a network environment for transferring data, including audio elements, to a browser of a client system, where the audio elements are playable in association with a browser window at the client system.

Referring now to FIG. 1, a block diagram depicts one embodiment of a network environment for transferring data, including audio elements, to a browser of a client system, where the audio elements are playable in association with a browser window at the client system. Network environment 100 is a network of computers in which one embodiment of the invention may be implemented. It will be understood that other embodiments of systems enabled to communicate via a connection may implement the present invention.

In the embodiment, network environment 100 includes network 102, which is the medium used to provide communication links between various devices and computer systems connected together within network environment 100. Network 102 may include permanent connections, such as wire or fiber optics cables, and temporary connections made through telephone connections and wireless transmission connections, for example. In addition, network 102 may represent one or more types of network elements implemented for enabling communicative connections between systems. For example, network 102 may include, but is not limited to, the Internet, one or more wide area networks (WANs), one or more local area networks (LANs), an Ethernet, a token ring, and one or more network service providers. Further, network 102 may transport data between systems using one or more types of communication protocols. In one example, network 102 implements protocols for transferring data within a packet-switching network, such as using the transmission control protocol/internet protocol (TCP/IP), however, network 102 may include multiple gateways, routers, and other hardware, software and other elements to enable integration of networks using additional or alternate protocols and additional or alternate layers of protocols.

In the example, network 102 enables communicative connection between a server 110 and one or more client systems, such as client systems 120 and 130. It will be understood that each of server 110 and client systems 120 and 130 may be distributed in geographically the same or disparate locations throughout homogeneous or heterogeneous types of computing systems operating within the same or disparate local networks. In addition, it will be understood that network environment 100 may include additional servers, clients, networks, and other devices that are not shown.

In one embodiment, network environment 100 implements a client/server architecture where server 110 performs as a server for responding to requests from client systems 120 and 130 and client systems 120 and 130 perform as clients requesting data from server 110. In addition, however, each of server 110 and client systems 120 and 130 may function as both a "client" and a "server" and may be implemented as a computer through a single or multiple computer systems, such as computer system 200 of FIG. 2, as will be further described. Further, while the present invention is described with emphasis upon server 110 facilitating the transfer of data to client systems 120 and 130, in an additional or alternate embodiment, clients 120 and 130 may also control communication by engaging in peer-to-peer network communications via network 102.

In particular, server 110 includes a data transfer controller 112 that facilitates transfer of requested data from deliverable data 114 to client system 120 and 130. It is important to note that with reference to the term "data", such as in the context of deliverable or transferred data, the data may include any type of network transferable data in one or more protocols. For example, data may include, but is not limited to, web pages, graphics, data files, electronic mail, and sound files. In transferring data via data transfer controller 112, data may be downloaded or streamed to one of client systems 120 or 130. In addition, it will be understood that data transfer controller 112 may include hardware, software, and other components for controlling delivery of deliverable data 114. In addition, it is important note that downloadable data 114 may reside at server 110 or server 110 may access downloadable data 114 from one or more systems via network 102 or another network.

The data included within deliverable data 114 may include display elements for display within a browser window and audio elements associated with one or more of the display elements. It is important to note that with reference to the term "audio element", an audio element may include, but is not limited to an audio file for download or streaming within a browser at a client system. In addition, an audio element may include the player required for playing the audio file at the client system. Further, an audio element may be incorporated within another file, player, or displayable element, including, but not limited to, a video file for download or streaming within a browser at a client system. In addition, it is important to note that with reference to the term "display element", a display element may include any graphically displayable element. An audio element is considered associated with a display element, in one example, if an interaction with the display element triggers any adjustment to the audio element. In another example, an audio element is considered associated with a display element if the coding for a web page or other data associates the audio element with a display element. Further, the client system receiving an audio element may automatically associate the audio element with a particular display element within a browser.

Client systems 120 and 130 include browsers 122 and 132, respectively, where browser 122 and 132 each provide an interface for viewing and playing selected data as the selected data is received from server 110 at each of client systems 120 and 130. In addition, browsers 122 and 132 may provide an interface through which data from among deliverable data 114 may be requested. It is important to note that browsers 122 and 132 may include any interface through which data accessed via a network is output. For example, browsers 122 and 132 may include, but are not limited to, general web browsers, such as Internet Explorer (Internet Explorer is a registered trademark of SyNet, Inc.) or Firefox (Firefox is a registered trademark of Mozilla Foundation) and data specific browsers, stand-alone players or plug-ins to a general web browser, such as iTunes (iTunes is a registered trademark of Apple Computer, Inc.), Adobe Acrobat (Adobe Acrobat is a registered trademark of Adobe Systems Incorporated), QuickTime (QuickTime is a registered trademark of Apple Computer, Inc.), and RealPlayer (RealPlayer is a registered trademark of RealNetworks, Inc.). In addition, it is important to note that browsers 122 and 132 may request data from server 110 while communicatively connected via network 102, store a copy of the data at client systems 120 and 130, respectively, and then, when no longer connected to server 110 via network 102 (e.g. operating off-line), enable a user to access the data in a browser window.

In addition, in the example, client systems 120 and 130 include scroll-based volume controllers 124 and 134, respectively. Each of scroll-based volume controllers 124 and 134 may be implemented as a separate, stand-alone application from browsers 122 and 132, respectively, or may be implemented through being embedded or inserted as a plug-in to either of browsers 122 and 132. In addition, each of scroll-based volume controllers 124 may be implemented within different operational layers or across multiple operational layers. For example, operational layers in which scroll-based volume controllers may be implemented include, but are not limited to, application layers and operating system layers.

Each of scroll-based volume controllers 124 and 134 monitor user adjustment of the portion of received data currently displayed within browser windows controlled by browsers 122 and 132, respectively. In particular, scroll-based volume controllers 124 and 134 detect user adjustment by monitoring whether the user selects to scroll through data displayed within a browser window. Responsive to detecting user adjustment of the portion of received data currently displayed, scroll-based volume controllers 124 and 134 automatically control volume adjustment of audio elements within the accessed data based on user adjustments, without the user having to separately select to adjust the volume of the audio element using a separate volume control input.

In other words, scroll-based volume controllers 124 and 134 automatically control volume adjustment of an audio element associated with a display element responsive to the adjustment in position of the display element relative to the a browser window as a user scrolls through a browser window, independent of the user separately selecting to adjust the volume of the audio element using a separate volume control input. It will be understood that there are other types of volume controllers that, when selected by the user using a separate volume control input independent of the user selecting to scroll through a browser window, control the volume of audio elements associated with display elements within a browser window. For example, a operating system or system application may detect a user selection of a dedicated volume control button on a keyboard or keypad, and the system then adjusts the volume of any playing audio in response to detecting selection of the volume control button. In another example, an operating system may provide or the display element associated with an audio element may include a separate, dedicated graphical volume control bar, where a user may select to increase or decrease the volume of an audio element by adjusting the position of a slider bar or other graphical object within the volume control bar.

It is important to note that the data received in association with a request from a particular browser window may include multiple audio elements and that one or more audio elements may be triggered to automatically begin playing and one or more other audio elements may be set to only begin play when selected by the user. Thus, in one example, scroll-based volume controllers 124 and 134 track the vertical scroll based adjustment in position of a display element with which an already playing audio element is associated and adjust the volume of the audio element by an amount reflective of the amount of adjustment in position of the display element into or out of the display area of the browser window. In another example, scroll-based volume controllers 124 and 134 track the horizontal scroll based adjustment in position of a display element with which an already playing audio element is associated and adjust the percentage of volume of the audio element output from each speaker to reflect the horizontal change in position of the associated display element. In yet another example, scroll-based volume controllers 124 and 134 track the scroll based adjustment in position of a display element with which a non-playing audio element is associated and determine whether to trigger play of the audio element based on the position of the display element within the display area of the browser window. It will be understood, as will also be further described, that scroll-based volume controllers 124 and 134 may detect additional types of user adjustments to display elements associated with audio elements and to browser window including display elements associated with audio elements and that scroll-based volume controllers 124 and 134 may perform other types of volume adjustment related to these detected user actions.

Figure 2:
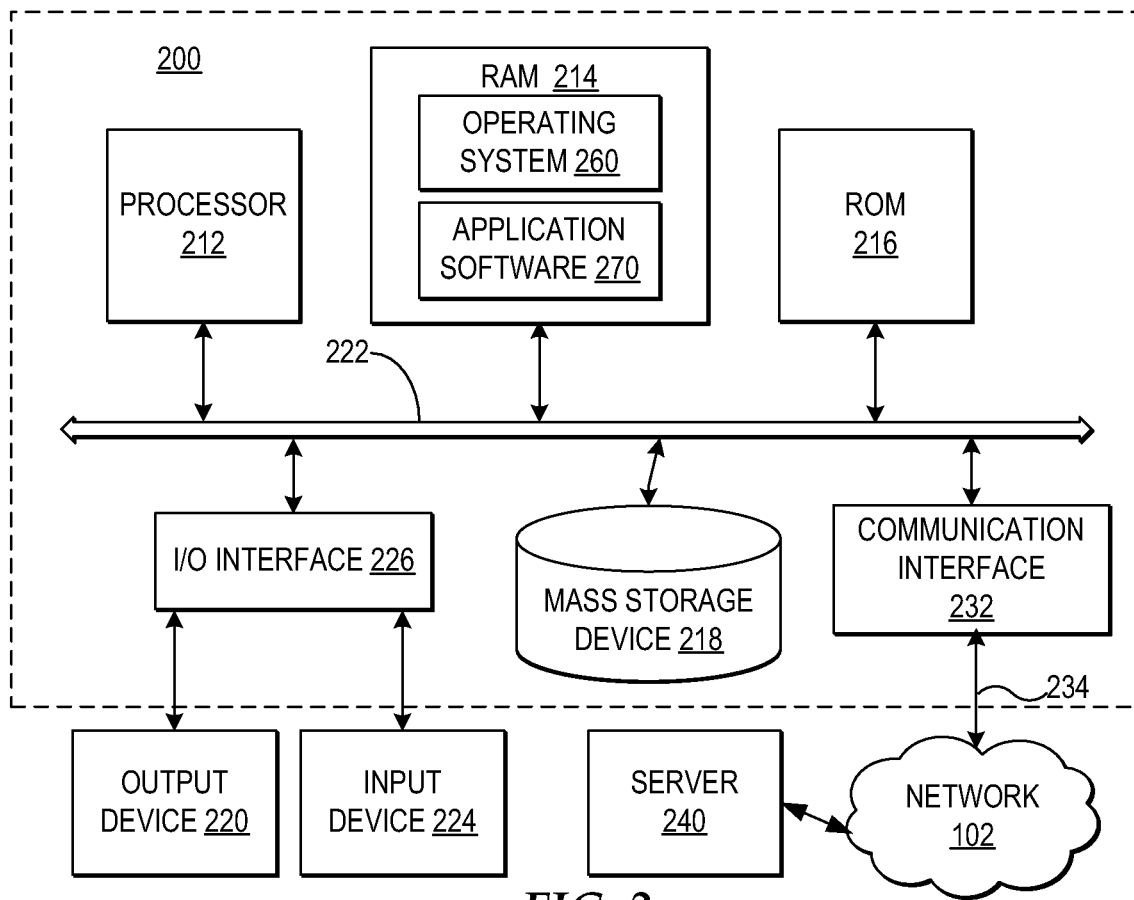
FIG. 2 is a block diagram depicting one embodiment of a computing system in which the present invention may be implemented.

Referring now to FIG. 2, a block diagram depicts one embodiment of a computing system in which the present invention may be implemented. The present invention may be executed in a variety of systems, including a variety of computing systems, such as computing system 200, communicatively connected to a network, such as network 102. For example, server system 110, client system 120 and client system 130 may be implemented using a computing system or grouping of computing systems, such as computing system 200. Further computing systems implemented within network 102 may be implemented using a computing system or grouping of computing systems, such as computing system 200.

Computer system 200 includes a bus 222 or other communication device for communicating information within computer system 200, and at least one processing device such as processor 212, coupled to bus 222 for processing information. Bus 222 preferably includes low-latency and higher latency paths that are connected by bridges and adapters and controlled within computer system 200 by multiple bus controllers. When implemented as a server, computer system 200 may include multiple processors designed to improve network servicing power. Where multiple processors share bus 222, additional controllers (not depicted) for managing bus access and locks may be implemented.

Processor 212 may be a general-purpose processor such as IBM's PowerPC (PowerPC is a registered trademark of International Business Machines Corporation) processor that, during normal operation, processes data under the control of an operating system 260, application software 270, middleware (not depicted), and other code accessible from a dynamic storage device such as random access memory (RAM) 214, a static storage device such as Read Only Memory (ROM) 216, a data storage device, such as mass storage device 218, or other data storage medium. In one embodiment, the operations performed by processor 212 may control dynamic adjustment of the volume of an audio element associated with a display element within a browser window as depicted in the operations of the flowchart in FIG. 7 and other operations described herein. Operations performed by processor 212 may be requested by operating system 260, application software 270, middleware or other code or the steps of the present invention might be performed by specific hardware components that contain hardwired logic for performing the steps, or by any combination of programmed computer components and custom hardware components.

The present invention may be provided as a computer program product, included on a machine-readable medium having stored thereon the machine executable instructions used to program computer system 200 to perform a process according to the present invention. The term "machine-readable medium" as used herein includes any medium that participates in providing instructions to processor 212 or other components of computer system 200 for execution. Such a medium may take many forms including, but not limited to, non-volatile media, volatile media, and transmission media. Common forms of non-volatile media include, for example, a floppy disk, a flexible disk, a hard disk, magnetic tape or any other magnetic medium, a compact disc ROM (CD-ROM) or any other optical medium, punch cards or any other physical medium with patterns of holes, a programmable ROM (PROM), an erasable PROM (EPROM), electrically EPROM (EEPROM), a flash memory, any other memory chip or cartridge, or any other medium from which computer system 200 can read and which is suitable for storing instructions. In the present embodiment, an example of a non-volatile medium is mass storage device 218 which as depicted is an internal component of computer system 200, but will be understood to also be provided by an external device. Volatile media include dynamic memory such as RAM 214. Transmission media include coaxial cables, copper wire or fiber optics, including the wires that comprise bus 222. Transmission media can also take the form of acoustic or light waves, such as those generated during radio frequency or infrared data communications.

Moreover, the present invention may be downloaded or distributed as a computer program product, wherein the program instructions may be transferred from a remote computer such as a server 240 to requesting computer system 200 by way of data signals embodied in a carrier wave or other propagation medium via network 102 to a network link 234 (e.g. a modem or network connection) to a communications interface 232 coupled to bus 222. Communications interface 232 provides a two-way data communications coupling to network link 234 that may be connected, for example, to a local area network (LAN), wide area network (WAN), or directly to an Internet Service Provider (ISP). In particular, network link 234 may provide wired and/or wireless network communications to one or more networks, such as network 102. Further, although not depicted, communication interface 232 may include software, such as device drivers, hardware, such as adapters, and other controllers that enable communication. When implemented as a server, computer system 200 may include multiple communication interfaces accessible via multiple peripheral component interconnect (PCI) bus bridges connected to an input/output controller, for example. In this manner, computer system 200 allows connections to multiple clients via multiple separate ports and each port may also support multiple connections to multiple clients.

Network link 234 and network 202 both use electrical, electromagnetic, or optical signals that carry digital data streams. The signals through the various networks and the signals on network link 234 and through communication interface 232, which carry the digital data to and from computer system 200, may be forms of carrier waves transporting the information.

In addition, computer system 200 may include multiple peripheral components that facilitate input and output. These peripheral components are connected to multiple controllers, adapters, and expansion slots, such as input/output (I/O) interface 226, coupled to one of the multiple levels of bus 222. For example, input device 224 may include, for example, a microphone, a video capture device, a body scanning system, a keyboard, a mouse, or other input peripheral device, communicatively enabled on bus 222 via I/O interface 226 controlling inputs. In addition, for example, a display device 220 communicatively enabled on bus 222 via I/O interface 226 for controlling outputs may include, for example, one or more graphical display devices, audio speakers, and tactile detectable output interfaces, but may also include other output interfaces. In alternate embodiments of the present invention, additional or alternate input and output peripheral components may be added.

Those of ordinary skill in the art will appreciate that the hardware depicted in FIG. 2 may vary. Furthermore, those of ordinary skill in the art will appreciate that the depicted example is not meant to imply architectural limitations with respect to the present invention.

Figure 3:
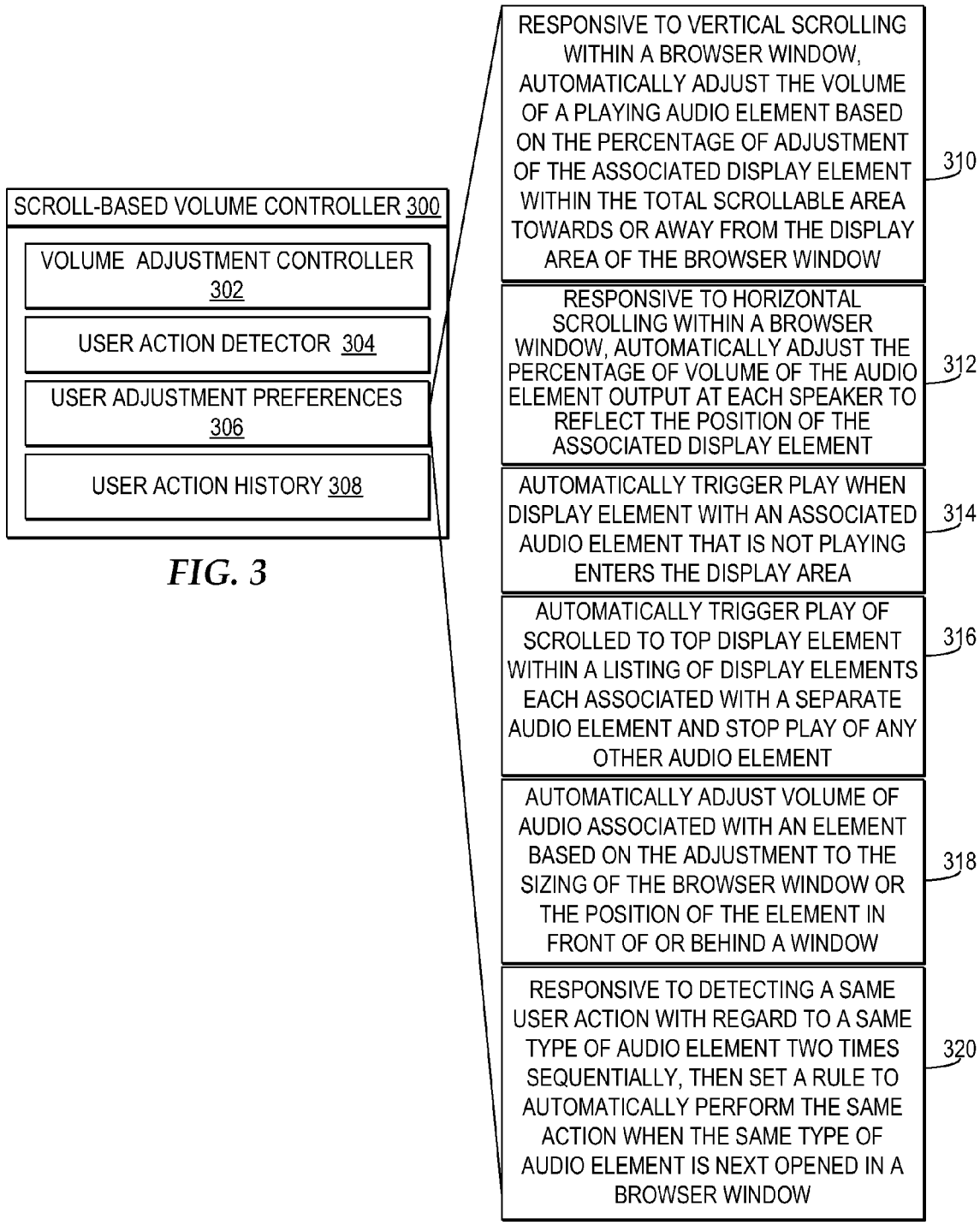
FIG. 3 is a block diagram depicting examples of components of a scroll-based volume controller for automatically controlling dynamic adjustment of the volume of audio elements associated with data received within a browser.

Referring now to FIG. 3, a block diagram depicts examples of components of a scroll-based volume controller for automatically controlling dynamic adjustment of the volume of audio elements associated with data received within a browser. In the example, a scroll-based volume controller 300, representative of scroll-based volume controllers 124 and 134, includes multiple components. It will be understood scroll-based volume controller 300 may implement additional or alternate components and that scroll-based volume controller 300 may be implemented as stand-alone software or may be integrated within other code.

In the example, scroll-based volume controller 300 includes a volume adjustment controller 302 for selecting a volume adjustment to one or more audio elements and directing adjustment of the volume of the one or more audio elements. In one embodiment, volume adjustment controller 302 directs volume adjustment by sending a call to an operating system, device controller, or other system layer, requesting the volume adjustment to a particular audio element or to the volume set for the browser window. In another embodiment, volume adjustment controller 302 directs volume adjustment by directly sending a volume adjustment signal to the speakers or other audio output interface.

Volume adjustment controller 302 selects volume adjustments to audio elements associated with display elements opened within a browser window by detecting user actions in association with the display elements. In particular, a user action detector 304 detects selected user actions, such as a scrolling or resizing a browser window, and triggers volume adjustment controller 302 to respond to the user actions.

In the example, volume adjustment controller 302 selects volume adjustments responsive to user actions according to user adjustment preferences 306. User adjustment preferences 306 may include, but are not limited to, preferences as to types of user actions that should trigger volume adjustments, particular types of audio elements for which the volume should be controlled, particular circumstances in which audio elements should be automatically triggered to be played, types of patterns in user behavior to track, and percentages of volume adjustment associated with scroll adjustments.

For example, user adjustment preferences 306 may include a preference illustrated at reference numeral 310 to "responsive to vertical scrolling within a browser window, automatically adjust the volume of a playing audio element based on the percentage of adjustment of the associated display element within the total scrollable area towards or away from the display area of the browser window." The preference illustrated at reference numeral 310 would be triggered when a user selects to vertically scroll through a browser window, where an audio element is already triggered to play in association with a display element within the browser window. In one example, where a browser window receives a web page with a video player as the display element, where the video with associated audio is already playing, as the user selects to scroll through the web page and view other portions of the web page, user action detector 304 triggers volume adjustment controller 302 to adjust the volume of the video audio element by a percentage indicative of the percentage of adjustment of the video player in relation to the display area of the browser window. As the user vertically scrolls the display element away from the display area, volume adjustment controller 302 would direct a reduction in the volume of the audio element and as the user vertically scrolls the display element towards the display area, volume adjustment controller 302 would direct an increase in the volume of the audio element.

In addition, for example, user adjustment preferences 306 may include a preference illustrated at reference numeral 312 to "responsive to horizontal scrolling within a browser window, automatically adjust the percentage of volume of audio element output at each speaker to reflect the position of the associated display element." The preference illustrated at reference numeral 312 would be triggered when a user selects to horizontally scroll within a browser window, where an audio element associated with a display element within the browser window is already triggered to play. In one example, where a browser window includes a web page with a displayed player for streaming audio, as the user scrolls within the browser window to shift the display element to the right, a greater percentage of the volume of the streamed audio element is increasingly output in the right speaker and as the user scrolls within the browser window to shift the display element to the left, a greater percentage of the volume of the audio element is increasingly output to the left speaker.

Further, for example, user adjustment preferences 306 may include a preference illustrated at reference numeral 314 to "automatically trigger play when display element with an associated audio element that is not playing enters the display area." The preference illustrated at reference numeral 314 would be triggered when user action detector 304 detects a user scrolling through data displayed within a browser window and a display element with an associated audio element that is not playing enters the display area of the browser window. In particular, user action detector 304 would detect the display element with an associated audio element that is not playing enter the display area of the browser window and direct volume adjustment controller 302 to trigger play of the associated audio element and then to control the volume of play based on the preferences illustrated at reference numerals 310 and 312.

In addition, for example, user adjustment preferences 306 may include a preference illustrated at reference numeral 316 to "automatically trigger play of the scrolled to top display element within a listing of display elements each with associated with a separate audio element." The preference illustrated at reference numeral 316 would be triggered when user action detector 304 detects a user scrolling through a list of display elements, such as a list of display elements, where selection of each display element triggers a request for download or streaming of a separate audio file. In one example, when a user is searching for music to download, the user may access a web page with a listing of songs, each represented by a display element, and responsive to a user clicking on a particular display element or highlighting the display element and pressing a key, the browser requests a sample of the music and plays the sample at the client system. In this embodiment, however, according to the preference illustrated at reference numeral 316, as the user scrolls through the display elements, user action detector 304 triggers volume adjustment controller 302 to trigger play of the audio element associated with each display element as the display element reaches the top of the list.

Further, for example, user adjustment preferences 306 may include a preference illustrated at reference numeral 318 to "automatically adjust the volume of an audio element based on the adjustment to the sizing of the browser window including the associated display element or the position of the browser window with the associated display element in front of or behind another window." The preference illustrated at reference numeral 318 would be triggered when user action detector 304 detects a user adjust the size of a browser window with a display element with an associated audio element that is currently playing or detects a user adjust the z-order of the browser window with a display element with an associated audio element. For example, responsive to the preference illustrated at reference numeral 318, volume adjustment controller 302 may decrease the volume of an audio element if the browser window with the associated display element is decreased. In another example, responsive to the preference illustrated at reference numeral 318, volume adjustment controller 301 may increase the volume of an audio element if the browser window with the associated display element is brought to the front of the z-order of multiple windows currently opened within a display interface.

In addition, for example, user adjustment preferences 306 may include a preference illustrated at reference numeral 320 to "responsive to detecting a same user action with regard to a same type of audio element two times sequentially, then set a rule to automatically perform the same action when the same type of audio element is next opened in a browser window." In particular, as user action detector 304 detects user actions in relationship to audio elements within a browser window, user action detector 304 may store the detected actions in a user action history 308. In addition, user action detector 304 may detect patterns in user actions within user action history 308, according to rules defined in user adjustment preferences 306, and set new preferences within user adjustment preferences 306 based on detecting patterns that trigger specified rules, such as the rule illustrated at reference numeral 320.

It will be understood that additional and alternate types of preferences may be set and that additional and alternate types of parameters may be set. In addition, it will be understood that scroll-based volume controller 300 may include an interface application through which a user may select the parameters of user adjustment preferences 306 and view user action history 308.

Figure 4:
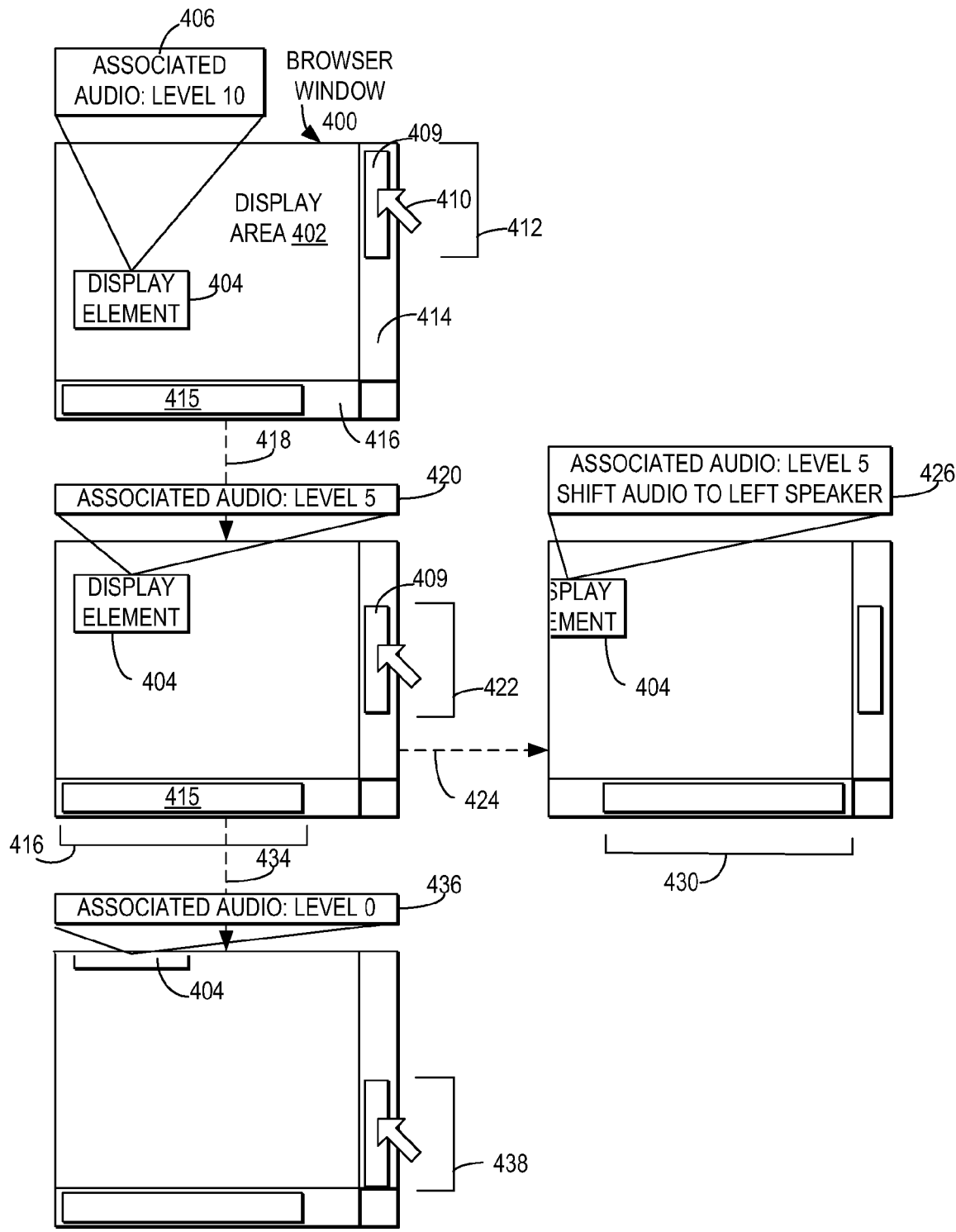
FIG. 4 is an illustrative diagram depicting an example of a dynamic decrease in the volume of an audio element associated with a display element within an opened web page in response to a user scrolling through the web page.

With reference now to FIG. 4, an illustrative diagram depicts an example of a dynamic decrease in the volume of an audio element associated with a display element within an opened web page in response to a user scrolling through the web page. In the example, a browser window 400 includes a display area 402 with a vertical scroll bar 414 and a horizontal scroll bar 416. In the example depicted, within vertical scroll bar 414, a user may select to vertically scroll through the portion of a web page displayed within display area 402 by adjusting the position of slider 409 and may select to horizontally scroll through the portion of a web page displayed within display area 402 by adjusting the position of slider 415. In one example, a user may adjust the position of slider 409 or slider 415 using a cursor 410 to select the slider and reposition the slider within scroll bar 414 or scroll bar 416. In addition, it will be understood that other types of inputs may be used to control the adjustment of position of sliders 409 and 415 including, but not limited to, selecting a downward-arrow key on a keyboard, voice requested adjustment and scroll wheel device adjustment.

Initially, in the example, a display element 404 is positioned within display areas 402 and an associated audio element is output at a volume level of "10", as illustrated at reference numeral 406. Slider 409 is positioned at a first vertical position 412.

Next, a user adjusts the position of slider 409 from a first vertical position 412 to a second vertical position 422, as indicated by the transition at reference numeral 418. Responsive to the user adjusting the position of slider 409, the position of display element 404 is adjusted within display area 402 from the bottom left quadrant of the display area to the top left quadrant of the display area. In addition, responsive to the adjustment in position of display element 404, scroll-based volume controller 300 detects the adjustment in position of display element 404 with an associated audio element and automatically, dynamically adjusts the volume of the associated audio element. In particular, in the example, scroll-based volume controller 300 detects that the user has scrolled slider 409 through 50% of the total scrollable area, with display element 404 scrolled away from display area 402 and therefore, scroll-based volume controller 300 controls a reduction in the volume of the audio element associated with display element 404 to 50% of the available volume, or a reduction from a volume level of "10" to a volume level of "5", as illustrated at reference numeral 420. It will be understood that scroll-based volume controller 300 may detect the adjustment of slider 409 and incrementally adjust the volume level from "10" to "5" as the user adjusts the position of slider 409.

Thereafter, in one example, a user adjusts the position of slider 415 from a first horizontal position 426 to a second horizontal position 430, as indicated by the transition at reference numeral 424. Responsive to the user adjusting the position of slider 415 from the left to the right within scroll bar 416, the position of display element 404 is adjusted within display area 402 to the left, partially edging out of display area 402. In addition, responsive to the adjustment in position of display element 404, scroll-based volume controller 300 detects the adjustment in position of display element 404 with an associated audio element and automatically, dynamically adjusts the volume distributed among the left speaker and the right speaker. In particular, in the example, scroll-based volume controller 300 detects that the user scrolling action has moved slider 415 fully to the right within the space of scroll bar 416 and therefore, scroll-based volume controller 300 controls a shift in the volume of the audio element associated with display element 404 fully to the left speaker, reflective of the repositioning of display element 404 to the left edge of display area 402, as illustrated at reference numeral 426. It will be understood that in an alternate example, a percentage of the volume may be shifted to the left speaker and that prior to shifting the position of slider 415, all or a portion of the volume may be output primarily from the right speaker. Alternatively, prior to shifting the position of slider 415 the volume may be distributed among the right and left speakers based on the relative position of display element 402 within display area 402.

Alternatively, in the example, a user adjusts the position of slider 409 from a second vertical position 422 to a third vertical position 438, as indicated by the transition at reference numeral 438. Responsive to the user adjusting the position of slider 409 to the bottom of scroll bar 414, the position of display element 404 is adjusted to outside the top edge boundary of display area 402. In addition, responsive to the adjustment in position of display element 404 within display area 402, scroll-based volume controller 300 detects the adjustment in position of display element 404 with an associated audio element and automatically, dynamically adjust the volume of the associated audio element. In particular, in the example, because the user has scrolled to the bottom of scroll bar 414, scroll-based volume controller 300 controls a reduction in the volume of the audio element associated with display element 404 by reducing the volume to "0", as illustrated at reference numeral 436.

Figure 5:
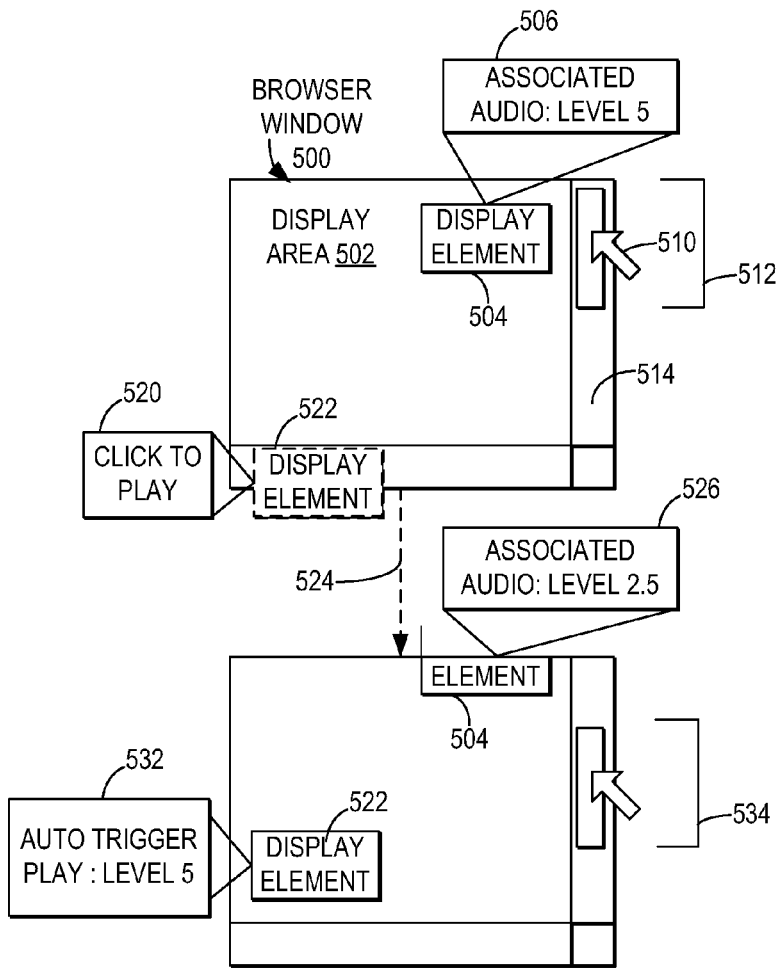
FIG. 5 is an illustrative diagram depicting an example of automatically triggering play of an audio element associated with a display element displayed within a browser window.

Referring now to FIG. 5, an illustrative diagram depicts an example of automatically triggering play of an audio element associated with a display element displayed within a browser window. In the example, a browser window 500 includes a display area 502 for displaying a web page or other downloadable data. A display element 504 is associated with a first audio element embedded with display element 504. In the example, the first audio element associated with display element 504 is playing at a volume of "5". In addition, in the example, the loaded web page includes a display element 522 associated with a second audio element. The second audio element is not playing and display element 522 is not part of the portion of the web page displayable within display area 502, as indicated by the dotted line indicating the relative position of display element 522 outside of display area 502 of browser window 500.

Next, a user selects to adjust the position of a slider 510 within scroll bar 514, using a cursor or other scroll triggering input, from a first vertical position 512 to a second vertical position 534, as indicated by the transition at reference numeral 524. Scroll-based volume controller 300 detects the scrolling adjustment and therefore detects that responsive to the scrolling adjustment, display element 522 is scrolled into display area 502 and display element 504 is scrolled out of the top edge of display area 502. Responsive to detecting element 504 scrolled out of the top edge of display area 502, following the user preference indicated at reference numeral 310 in FIG. 3, scroll-based volume controller 300 automatically reduces the volume of the first audio element associated with display element 504 as illustrated at reference numeral 526. In addition, responsive to detecting display element 522 enter display area 502, following the user preference indicated at reference numeral 314 in FIG. 3, scroll-based volume controller 300 automatically triggers play of the second audio element associated with display element 522, as illustrated at reference numeral 532. In the example, when play of an element is automatically triggered, the user may select a preference as to the volume to assign to the element or the volume may be triggered at a default set with the audio element itself.

It will be understood that in addition to volume adjustments, scroll-based volume controller 300 may also control distribution of the volume associated with each of the first audio element and second audio element among the available speakers to distinguish the elements. In addition, it will be understood that scroll-based volume controller 300 may add sound effects or other audio distortion to the first audio element or second audio element to distinguish the two audio elements or to indicate that scroll-based volume controller 300 triggered the play of the second audio element.

Figure 6:
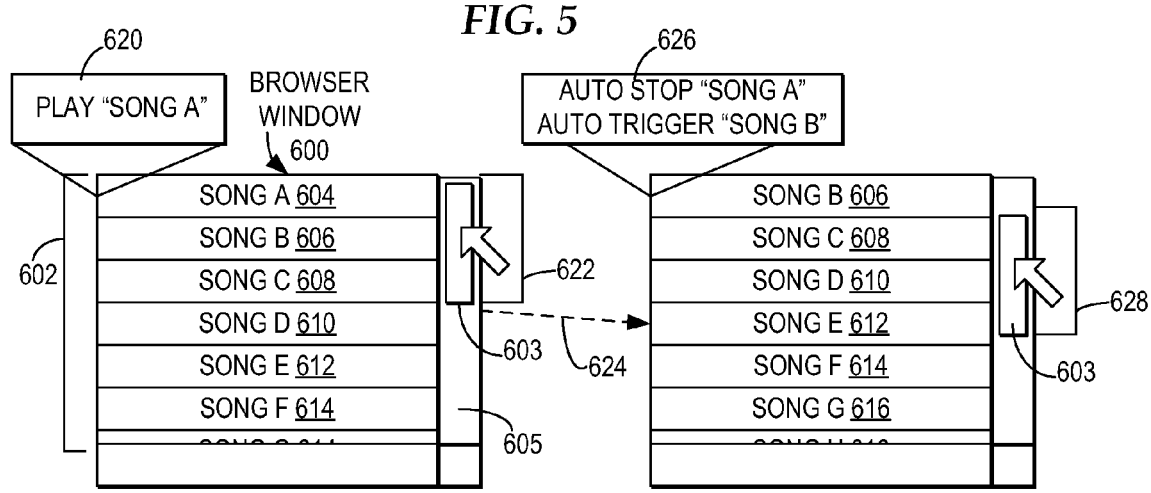
FIG. 6 is an illustrative diagram depicting an example of automatically triggering play of an audio element associated with a display element within a list of display elements responsive to a user selecting to scroll through the list of display elements.

With reference now to FIG. 6, an illustrative diagram depicts an example of automatically triggering play of an audio element associated with a display element within a list of display elements responsive to a user selecting to scroll through the list of display elements. In the example, a browser window 600 includes multiple display elements, representing a list of selectable songs, indicated as "song A" at reference numeral 604, "song B" at reference numeral 606, "song C" at reference numeral 608, "song D" at reference numeral 610, "song E" at reference numeral 612, and "song F" at reference numeral 614. A separate song, or audio element, is associated with each of display elements 604, 606, 608, 610, 612, and 614. In addition, in the example, the audio element associated with display element, "song A" at reference numeral 604 is already playing, at a volume of "5", as indicated at reference numeral 620.

It is important to note that while in the example the list of display elements is illustrated within a display area 602 of an individual browser window 600, browser window 600 may be incorporated within one or more other browser windows. For example, browser window 600 may be an element within a web page displayed within a larger browser window, where the web page provides an interface through which a user may select to listen to samples of songs through selecting the display elements for the songs and the user may also select to purchase a full length, downloadable copy of each of the songs.

Initially, in the example, a slider 603 is positioned at a first vertical position 622 within a scroll bar 605. Next, a user adjusts the position of slider 603 from first vertical position 622 to a second vertical position 628, as indicated by the transition at reference numeral 624. Responsive to the user selection to scroll adjust the position of slider 603 to scroll within browser window 600, the display element "song A" at reference numeral 604 is scrolled out of a display area 602 of browser window 600. In addition, responsive to the user selection to scroll within browser window 600, another display element, "song G" at reference numeral 616, scrolls into the list of display elements and another audio element is associated with display element "song G" at reference numeral 616. Further, scroll-based volume controller 300 detects the adjustment to slider 603 within a list of display elements, each associated with an audio element. As illustrated at reference numeral 626, following user preference 316 in FIG. 3, scroll-based volume controller 300 automatically stops play of the audio element in play and automatically triggers play of the audio element associated with the display element at the top of the list, "song B" at reference numeral 606.

Figure 7:
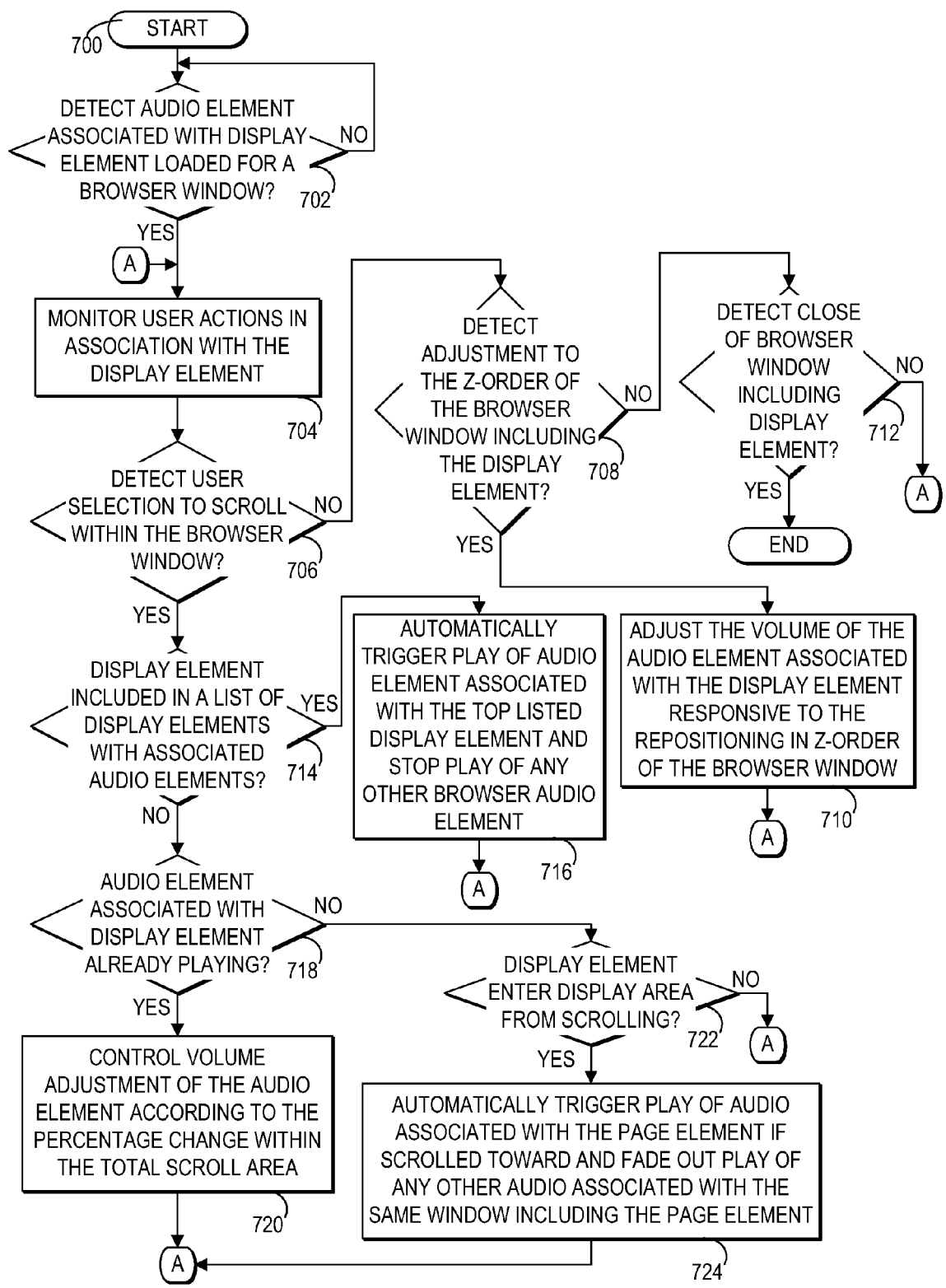
FIG. 7 is a high level logic flowchart depicting a process and program for scroll-based volume control adjustment in accordance with the method, system, and program of the present invention.

Referring now to FIG. 7, a high level logic flowchart depicts a process and program for scroll-based volume control adjustment in accordance with the method, system, and program of the present invention. As illustrated, at the process starts at block 700 and thereafter proceeds to block 702. Block 702 depicts a determination whether the scroll-based volume controller detects an audio element associated with a display element accessed for an open browser window. If the scroll-based volume controller detects an audio element associated with a display element accessed for an open browser window, then the process passes to block 704. Block 704 illustrates monitoring user actions in association with the display element, and the process passes to block 706.

Block 706 depicts a determination whether the scroll-based volume controller detects a user selection to scroll within the browser window including the display element. If the scroll-based volume controller does not detect a user selection to scroll, then the process passes to block 708. Block 708 depicts a determination whether the scroll-based volume controller detects an adjustment to the z-order of the browser window including the display element. If the scroll-based volume controller detects an adjustment to the z-order of the browser window including the display element, then the process passes to block 710. Block 710 depicts adjustment the volume of the audio output in association with the display element responsive to the repositioning in z-order of the browser window including the display element, and the process returns to block 704.

Returning to block 708, if the scroll-based volume controller does not detect an adjustment to the z-order of the browser window including the display element, then the process passes to block 712. Block 712 depicts a determination whether the scroll-based volume controller detects the browser window including the display element close. If the scroll-based volume controller detects the browser window including the display element close, then the process ends. If the scroll-based volume controller does not detect the browser window close, then the process returns to block 704.

Returning to block 706, if user scrolling within the browser window is detected, then the process passes to block 714. Block 714 depicts a determination whether the display element is included in a list of display elements, each with a separate associated audio element. If the display element is included in a list of display elements, each with a separate associated audio element, then the process passes to block 716. Block 716 depicts automatically triggering play of the audio element associated with the top listed page element in the list and automatically stopping play of any other audio elements, and the process returns to block 704.

Returning to block 714 if the page element is not in a list of display elements, each with a separate associated audio element, then the process passes to block 718. Block 718 depicts a determination whether the audio element associated with the display element is already playing. If the audio element associated with the display element is already playing, then the process passes to block 720. Block 720 depicts controlling a volume adjustment according to the percentage change in the total scroll area of the slider and the direction of movement of the display element into or out of the display area of the browser window, and the process returns to block 704.

Otherwise, returning to block 718, if the audio element is not already playing, then the process passes to block 722. Block 722 depicts a determination whether the display element enters the display area of the browser window responsive to the scrolling. If the display element does not enter the display area of the browser window responsive to the scrolling, then the process returns to block 704. If the display element does enter the display area of the browser window responsive to the scrolling, then the process passes to block 724. Block 724 depicts automatically triggering play of the audio element associated with the display element and fading the volume of any other audio elements already playing, and the process ends.

While the invention has been particularly shown and described with reference to a preferred embodiment, it will be understood by those skilled in the art that various changes in form and detail may be made therein without departing from the spirit and scope of the invention.

What is claimed is:

1. A method for dynamically adjusting a volume of an audio element associated with a display element within a browser window, comprising:
    receiving, at a client system, data and coding for a web page comprising at least one display element and an audio element associated with said display element by the coding for the web page, wherein the at least one audio element comprises an audio file for download within a browser;
    displaying said web page within a particular browser window of said browser;
    responsive to detecting, at a controller of said client system enabled to monitor user activity in association with at least one browser window opened by the browser, a user selection to scroll through the particular browser window loaded with data for the web page comprising the at least one display element, calculating a change in position of said display element relative to said particular browser window;
    automatically adjusting a volume, by said controller, of said audio element based on said calculated change in position of said display element relative to said particular browser window, such that said volume of said audio element, associated with said display element, is automatically adjusted as the position of said display element changes relative to said particular browser window when said user scrolls through said data in said at least one browser window;
    recording, by said controller, each separate additional user action with regard to said display element and said audio element in a user action history;
    detecting, by a user action detector, a pattern of a particular action performed at least twice within said separate user actions in said user action history; and
    setting at least one rule to automatically perform said particular action when a same type of audio element as said audio element in said particular browser window is next opened in a next browser window by said browser.

2. The method according to claim 1, further comprising:
    detecting whether said at least one display element is shifting away from a display area of said particular browser window responsive to said user selection to scroll through said particular browser window;
    responsive to detecting said at least one display element shifting away from said display area of said particular browser window, automatically calculating an adjustment in volume for said audio element reduced by said calculated change in position of said display element relative to said particular browser window; and
    responsive to detecting said at least one display element moving towards said display area of said particular browser window, automatically calculating an adjustment in volume for said audio element increased by said calculated change in position of said display element relative to said particular browser window.

3. The method according to claim 1, further comprising:
    detecting whether said at least one display element is shifting at least one of to the left or to the right of a display area of said particular browser window responsive to said user selection to scroll through said particular browser window;
    responsive to detecting said at least one display element shifting to the left of said display area of said particular browser window, automatically calculating an adjustment in volume for said audio element to shift a portion of said volume to at least one left speaker; and
    responsive to detecting said at least one display element shifting to the right of said display area of said particular browser window, automatically calculating an adjustment in volume for said audio element to shift a portion of said volume to at least one right speaker.

4. The method according to claim 1, further comprising:
    accessing said data as a web page of a total size larger than a display area of said particular browser window.

5. The method according to claim 1, further comprising:
    accessing said data comprising said display element with said associated audio element, wherein said display element is a streaming video.

6. The method according to claim 1, further comprising:
    detecting said display element is within a list of a plurality of display elements, each associated with a separate audio element from among a plurality of audio elements loaded in said data; and
    responsive to detecting said display element scrolled to a particular display position within said list of said plurality of display elements, automatically triggering play of said audio element associated with said display element.

7. The method according to claim 1, further comprising:
    responsive to said scrolling, detecting whether said display element is adjusted in position from a first position outside a display area of said particular browser window to a second position within said display area of said particular browser window;
    responsive to detecting said display element at said second position within said display area, detecting whether said audio element associated with said display element requires a user selection to begin play; and
    responsive to detecting said audio element requiring a user selection to begin play, automatically triggering said audio element to begin play upon entry into said display area of said particular browser window according to a user preference to automatically trigger play of any display element with an associated audio element scrolled into a display area of said at least one browser window.

8. A system for dynamically adjusting a volume of an audio element associated with a display element within a browser window, comprising:
    a client system for receiving data and coding for a web page comprising at least one display element and an audio element associated with said display element by the coding for the web page, wherein the at least one audio element comprises an audio file for download within a browser and displaying said web page within a particular browser window of said browser;
    a scroll-based volume controller for monitoring user activity in association with at least one browser window opened by the browser;
    said scroll-based volume controller further comprising:

means, responsive to detecting a user selection to scroll through the particular browser window loaded with data comprising the at least one display element, for calculating a change in position of said display element relative to said particular browser window;

means for automatically adjusting a volume of said audio element based on said calculated change in position of said display element relative to said particular browser window;

means for recording each separate additional user action with regard to said display element and said audio element in a user action history; and a user action detector detecting a pattern of a particular action performed at least twice within said separate user actions in said user action history and setting at least one rule to automatically perform said particular action when a same type of audio element as said audio element in said particular browser window is next opened in a next browser window by said browser.

9. The system according to claim 8, said scroll-based volume controller further comprising:

means for detecting whether said at least one display element is shifting away from a display area of said particular browser window responsive to said user selection to scroll through said particular browser window;

means, responsive to detecting said at least one display element shifting away from said display area of said particular browser window, for automatically calculating an adjustment in volume for said audio element reduced by said calculated change in position of said display element relative to said particular browser window; and means, responsive to detecting said at least one display element moving towards said display area of said particular browser window, for automatically calculating an adjustment in volume for said audio element increased by said calculated change in position of said display element relative to said particular browser window.

10. The system according to claim 8, said scroll-based volume controller further comprising:

means for detecting whether said at least one display element is shifting at least one of to the left or to the right of a display area of said particular browser window responsive to said user selection to scroll through said particular browser window;

means, responsive to detecting said at least one display element shifting to the left of said display area of said particular browser window, for automatically calculating an adjustment in volume for said audio element to shift a portion of said volume to at least one left speaker; and means, responsive to detecting said at least one display element shifting to the right of said display area of said particular browser window, for automatically calculating an adjustment in volume for said audio element to shift a portion of said volume to at least one right speaker.

11. The system according to claim 8, said scroll-based volume controller further comprising:

means for accessing said data as a web page of a total size larger than a display area of said particular browser window.

12. The system according to claim 8, said scroll-based volume controller further comprising:

means for accessing said data comprising said display element with said associated audio element, wherein said display element is a streaming video.

13. The system according to claim 8, said scroll-based volume controller further comprising:

means for detecting said display element is within a list of a plurality of display elements, each associated with a separate audio element from among a plurality of audio elements loaded in said data; and means, responsive to detecting said display element scrolled to a particular display position within said list of said plurality of display elements, for automatically triggering play of said audio element associated with said display element.

14. The system according to claim 8, said scroll-based volume controller further comprising:

means, responsive to said scrolling, for detecting whether said display element is adjusted in position from a first position outside a display area of said particular browser window to a second position within said display area of said particular browser window;

means, responsive to detecting said display element at said second position within said display area, for detecting whether said audio element associated with said display element requires a user selection to begin play; and means, responsive to detecting said audio element requiring a user selection to begin play, automatically triggering said audio element to begin play upon entry into said display area of said particular browser window according to a user preference to automatically trigger play of any display element with an associated audio element scrolled into a display area of said at least one browser window.

15. A program for dynamically adjusting a volume of an audio element associated with a display element within a browser window, said program embodied in a non-transitory computer-readable medium, said program comprising computer-executable instructions which cause a computer to perform the steps of:

receiving data and coding for a web page comprising at least one display element and an audio element associated with said display element by the coding for the web page, wherein the at least one audio element comprises an audio file for download within a browser;

displaying said web page within a particular browser window of said browser;

monitoring user selections in association with at least one browser window opened by the browser;

responsive to detecting a user selection to scroll through the particular browser window loaded with data comprising at least one display element, calculating a change in position of said display element relative to said particular browser window;

automatically adjusting a volume of said audio element based on said calculated change in position of said display element relative to said particular browser window;

recording each separate additional user action with regard to said display element and said audio element in a user action history;

detecting a pattern of a particular action performed at least twice within said separate user actions in said user action history; and setting at least one rule to automatically perform said particular action when a same type of audio element as said audio element in said particular browser window is next opened in a next browser window by said browser.

16. The program according to claim 15, said program further comprising computer-executable instructions which cause a computer to perform the steps of:

detecting whether said at least one display element is shifting away from a display area of said particular browser window responsive to said user selection to scroll through said particular browser window;

responsive to detecting said at least one display element shifting away from said display area of said particular browser window, automatically calculating an adjustment in volume for said audio element reduced by said calculated change in position of said display element relative to said particular browser window; and responsive to detecting said at least one display element moving towards said display area of said particular browser window, automatically calculating an adjustment in volume for said audio element increased by said calculated change in position of said display element relative to said particular browser window.

17. The program according to claim 15, said program further comprising computer-executable instructions which cause a computer to perform the steps of:

detecting whether said at least one display element is shifting at least one of to the left or to the right of a display area of said browser window responsive to said user selection to scroll through said browser window;

responsive to detecting said at least one display element shifting to the left of said display area of said browser window, automatically calculating an adjustment in volume for said audio element to shift a portion of said volume to at least one left speaker; and responsive to detecting said at least one display element shifting to the right of said display area of said browser window, automatically calculating an adjustment in volume for said audio element to shift a portion of said volume to at least one right speaker.

18. The program according to claim 15, said program further comprising computer-executable instructions which cause a computer to perform the steps of:

detecting said display element is within a list of a plurality of display elements, each associated with a separate audio element from among a plurality of audio elements loaded in said data; and responsive to detecting said display element scrolled to a particular position within said list of said plurality of display elements, automatically triggering play of said audio element associated with said display element.

19. The method according to claim 1, further comprising:

responsive to detecting, by said controller, a second user selection to adjust a size of said particular browser window from a first size to a second size, calculating a change in size of said particular browser window from said first size to said second size; and automatically adjusting said volume, by said controller, of said audio element based on said calculated change in size, such that said volume of said audio element, associated with said display element, is automatically adjusted as the size of said particular browser window is adjusted.

20. The system according to claim 8, said scroll-based volume controller further comprising:

means, responsive to detecting a second user selection to adjust a size of said particular browser window from a first size to a second size, for calculating a change in size of said particular browser window from said first size to said second size; and means for automatically adjusting said volume, by said controller, of said audio element based on said calculated change in size, such that said volume of said audio element, associated with said display element, is automatically adjusted as the size of said particular browser window is adjusted.

* * * * *